(12) United States Patent
Illek

(10) Patent No.: US 8,325,778 B2
(45) Date of Patent: Dec. 4, 2012

(54) SURFACE EMITTING SEMICONDUCTOR LASER AND METHOD FOR PRODUCING IT

(75) Inventor: Stefan Illek, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 131 days.

(21) Appl. No.: 12/808,979

(22) PCT Filed: Dec. 10, 2008

(86) PCT No.: PCT/DE2008/002068
§ 371 (c)(1),
(2), (4) Date: Jul. 13, 2010

(87) PCT Pub. No.: WO2009/079986
PCT Pub. Date: Jul. 2, 2009

(65) Prior Publication Data
US 2010/0309944 A1 Dec. 9, 2010

(30) Foreign Application Priority Data

Dec. 21, 2007 (DE) .......................... 10 2007 062 128
Feb. 12, 2008 (DE) .......................... 10 2008 008 595

(51) Int. Cl.
*H01S 5/00* (2006.01)
*H01L 21/00* (2006.01)
(52) U.S. Cl. .................................. 372/50.124; 438/462
(58) Field of Classification Search ............. 372/50.124
See application file for complete search history.

(56) References Cited

U.S. PATENT DOCUMENTS

| 5,796,771 | A | 8/1998 | DenBaars et al. |
| 5,914,976 | A * | 6/1999 | Jayaraman et al. ........ 372/50.21 |
| 6,371,636 | B1 | 4/2002 | Wesson |
| 6,954,479 | B2 | 10/2005 | Albrecht et al. |
| 7,023,891 | B2 | 4/2006 | Haneda et al. |
| 7,224,710 | B2 | 5/2007 | Schmid et al. |
| 7,300,808 | B2 | 11/2007 | Albrecht et al. |
| 7,408,972 | B2 | 8/2008 | Schmid et al. |

(Continued)

FOREIGN PATENT DOCUMENTS

DE 100 40 448 A1 3/2002

(Continued)

OTHER PUBLICATIONS

Schnitzer, I., et al., "30% External Quantum Efficiency from Surface Textured, Thin-Film Light-Emitting Diodes," Applied Physics Letters, Oct. 18, 1993, 3 pages, American Institute of Physics.

*Primary Examiner* — Patrick Stafford
(74) *Attorney, Agent, or Firm* — Slater & Matsil, L.L.P.

(57) ABSTRACT

A surface emitting semiconductor laser includes a first semiconductor layer sequence, which comprises a pump laser. A second semiconductor layer sequence is arranged on the first semiconductor layer sequence and comprises a vertical emitter. The vertical emitter has a radiation-emitting active layer, a radiation exit side and a connecting side lying opposite the radiation exit side. The pump laser is arranged at the radiation exit side of the vertical emitter and a carrier body is arranged at the connecting side of the vertical emitter. Furthermore, a method for producing a surface emitting semiconductor laser is specified.

21 Claims, 4 Drawing Sheets

U.S. PATENT DOCUMENTS

| | | |
|---|---|---|
| 7,678,591 B2 | 3/2010 | Illek |
| 2005/0036528 A1 | 2/2005 | Schmid |
| 2006/0039437 A1 | 2/2006 | Albrecht et al. |
| 2006/0180804 A1 | 8/2006 | Stauss et al. |
| 2007/0217463 A1 | 9/2007 | Albrecht et al. |
| 2009/0304039 A1 | 12/2009 | Lutgen et al. |

FOREIGN PATENT DOCUMENTS

| | | |
|---|---|---|
| DE | 103 03 978 A1 | 11/2003 |
| DE | 103 20 376 A1 | 11/2003 |
| DE | 102 43 545 B4 | 4/2004 |
| DE | 10 2008 014 121 A1 | 6/2009 |
| WO | WO 98/31080 | 7/1998 |
| WO | WO 2005-048423 A1 | 5/2005 |
| WO | 10 2006 024 220 A1 | 10/2007 |
| WO | WO 2008/101481 A1 | 8/2008 |
| WO | WO 2009/109166 A2 | 9/2009 |

* cited by examiner

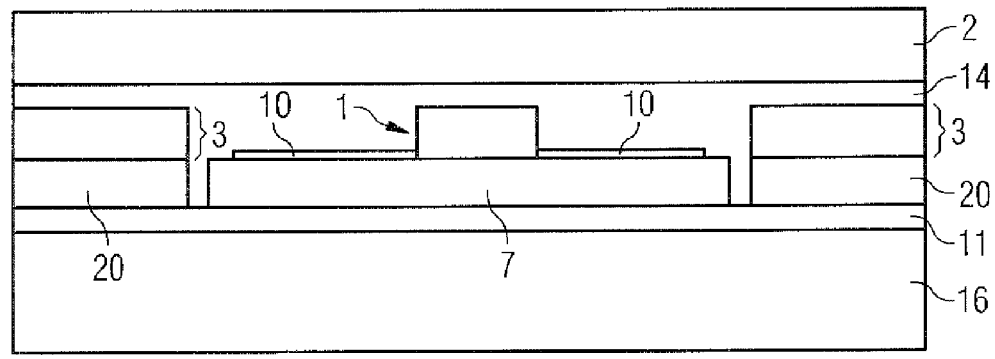
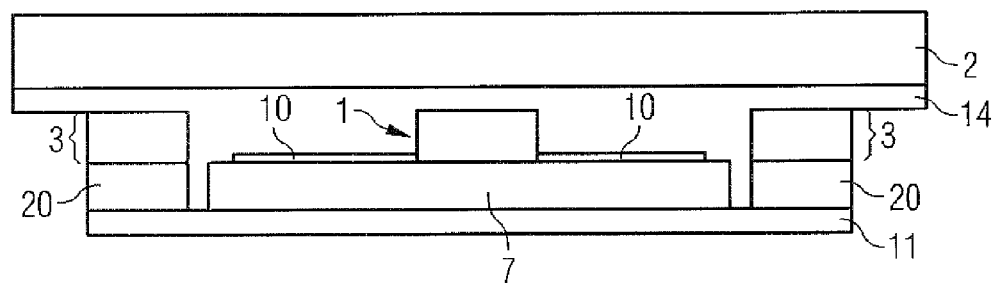
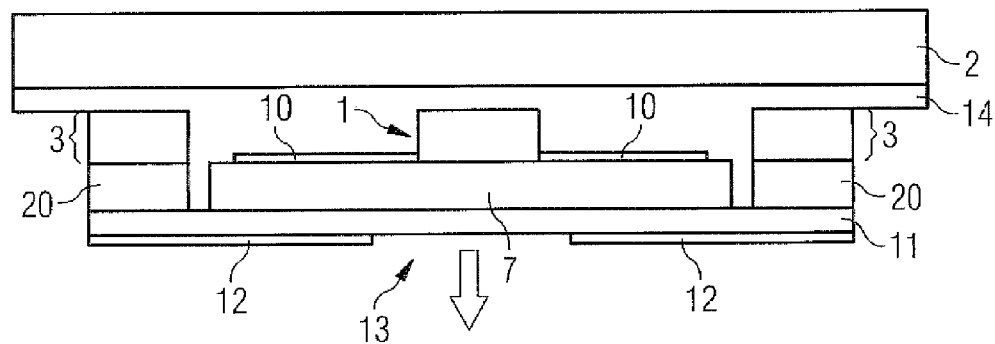

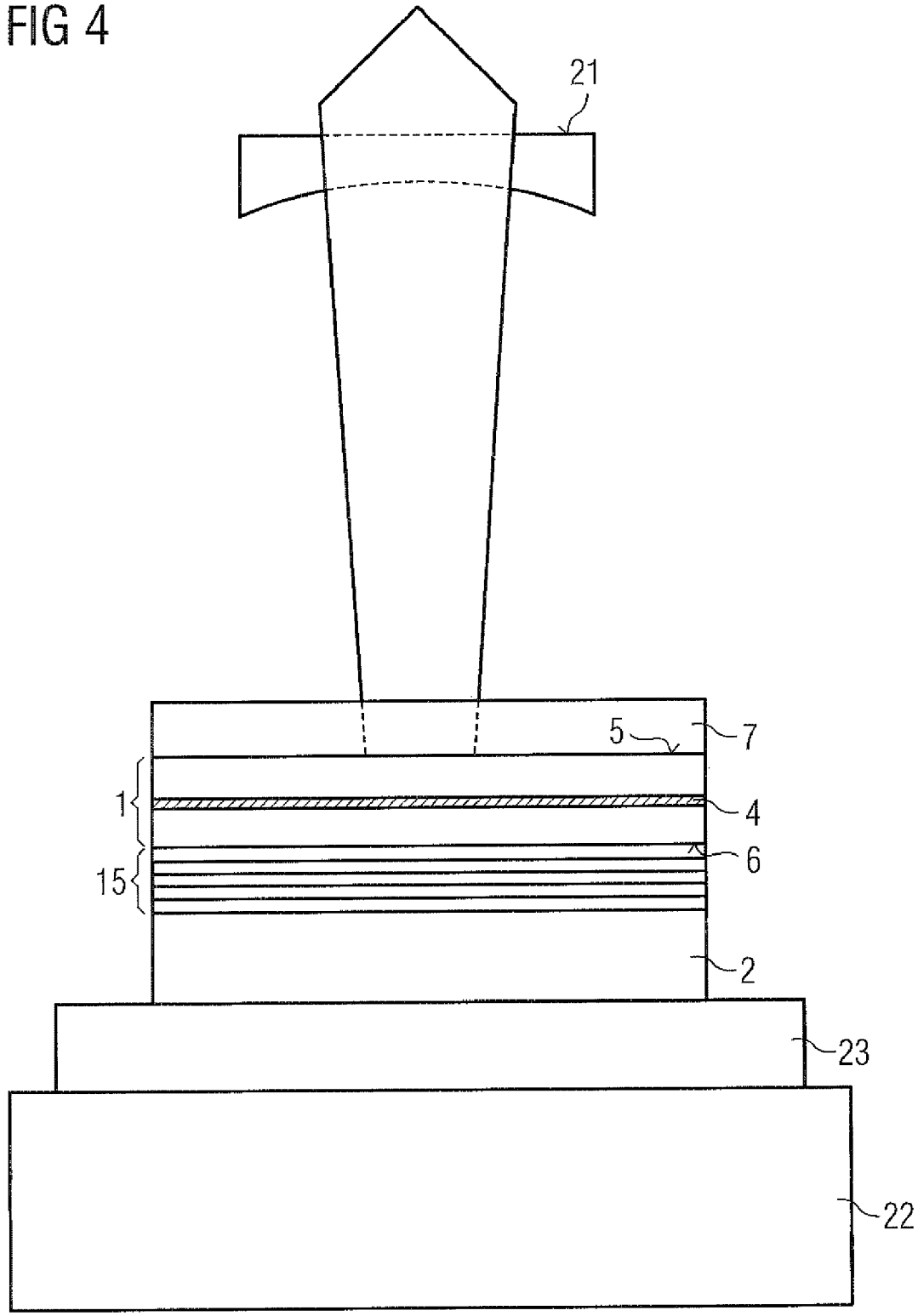

SURFACE EMITTING SEMICONDUCTOR LASER AND METHOD FOR PRODUCING IT

This patent application is a national phase filing under section 371 of PCT/DE2008/002068, filed Dec. 10, 2008, which claims the priority of German patent applications 10 2007 062 128.2, filed Dec. 21, 2007 and 10 2008 008 595.2, filed Feb. 12, 2008, each of which is incorporated herein by reference in its entirety.

TECHNICAL FIELD

Embodiments of the invention relate to a surface emitting semiconductor laser comprising a vertical emitter, a pump laser and a carrier body. Furthermore, embodiments of the invention relate to a method for producing such a surface emitting semiconductor laser.

BACKGROUND

In conventional surface emitting semiconductor lasers having an optically pumped vertical emitter and an integrated pump laser for optically pumping the vertical emitter, the generated radiation can be coupled out on the substrate side in order to improve the heat dissipation ("bottom emitter"). During the production of the epitaxial layer sequence, in this case the pump laser is arranged on a substrate and the vertical emitter is arranged on that side of the pump laser which is remote from the substrate. For the purpose of thermal coupling, on that side of the vertical emitter which is remote from the substrate, an galvanic layer containing gold, for example, is applied and subsequently planarized.

An optoelectronic component which has a semiconductor body with a vertical emitter region and a monolithically integrated pump source is known from DE 10 2006 024 220, U.S. equivalent Patent Application Publication No. 2009/0304039 A1, for example.

A method for producing semiconductor chips which have an galvanically applied reinforcement layer consisting of gold is known from the document DE 100 40 448 A1, U.S. equivalent U.S. Pat. No. 7,678,591, for example. In this case, an active layer is grown onto a substrate. Rear-side contact layers are formed on the active layer, a gold layer being applied to said contact layers by means of electroplating. After an auxiliary carrier layer has been applied to the reinforcement layer galvanically, the substrate is separated from the active layer.

The galvanically produced layer can lead to great strains, whereby further processing is adversely affected. Furthermore, strains can lead to damage within a semiconductor laser and, as a result, to a shorter service life.

Furthermore, great strains can make it more difficult to produce the surface emitting semiconductor laser. By way of example, strains which can arise as a result of the galvanic layer make it more difficult to process a plurality of semiconductor lasers on a common carrier body or wafer having a size of 100 mm or more, that is to say to produce semiconductor lasers in the wafer assemblage for mass production. By way of example, strains in the layers in the wafer assemblage can lead to warpages or cracks in the wafer which impede further processing of the wafer assemblage.

Furthermore, in conventional surface emitting semiconductor lasers which couple out the generated radiation on the substrate side, it is necessary to etch a light exit opening into the substrate for the purpose of coupling out radiation.

SUMMARY

Aspects of the invention specify a surface emitting semiconductor laser having an increased long-term stability, in particular having an increased service life. Furthermore, additional aspects of the invention specify a surface emitting semiconductor laser having a simplified process implementation which is distinguished, in particular, by reduced production costs and a reduced production time.

The invention provides a surface emitting semiconductor laser, having a first semiconductor layer sequence, which comprises a pump laser, and a second semiconductor layer sequence, which is arranged on the first semiconductor layer sequence and which comprises a vertical emitter. The vertical emitter has a radiation-emitting active layer, a radiation exit side and a connecting side lying opposite the radiation exit side. The pump laser is arranged at the radiation exit side of the vertical emitter. Consequently, the radiation generated by the active layer during operation is coupled out through the pump laser. The carrier body is arranged at the connecting side of the vertical emitter.

For the mechanical stabilization of the semiconductor laser, therefore, a substrate onto which the pump laser and the vertical emitter are arranged is not provided, rather a carrier body is provided, which is arranged on that side of the vertical emitter which lies opposite the radiation exit side. Consequently, an galvanic layer which contains gold, for example, and is applied on that side of the vertical emitter which is remote from the substrate is not used. As a result, strains which can occur as a result of the galvanic layer do not arise. Overall, the long-term stability of the semiconductor laser and also the service life are therefore advantageously increased. Furthermore, further processing of the semiconductor laser is made possible as a result since the strains occurring in the semiconductor laser are present in reduced fashion.

Furthermore, a growth substrate on which the first and the second semiconductor layer sequences were grown, is stripped away. Consequently, it is not necessary to etch a light exit opening for the radiation emitted by the vertical emitter into the growth substrate. Simplified production, and hence reduced production costs and a reduced production time for the surface emitting semiconductor laser are advantageously possible.

The surface emitting semiconductor laser is embodied as a thin-film semiconductor laser. In the context of the application, a thin-film semiconductor laser is considered to be a semiconductor laser during the production of which the growth substrate, onto which a first and a second semiconductor layer sequence were grown epitaxially, for example, is stripped away.

A basic principle of a thin-film chip is described for example in I. Schnitzer et al., Appl. Phys. Lett. 63 (16), Oct. 18, 1993, 2174-2176, the disclosure content of which in this respect is incorporated herein by reference.

The semiconductor laser furthermore comprises a carrier body, which mechanically stabilizes the vertical emitter and the pump laser and, particularly preferably, is different from the growth substrate for the first and the second semiconductor layer sequences of the semiconductor laser.

The carrier body of the thin-film semiconductor laser is advantageously not subject to the comparatively stringent requirements that have to be met by a growth substrate, for instance with regard to the crystal structure or the coefficient of expansion. The degrees of freedom in the choice of the carrier body are advantageously increased by comparison with the degrees of freedom in the choice of the growth substrate. By way of example, the carrier body can be chosen comparatively freely with regard to thermal properties such as a coefficient of thermal expansion adapted to the semiconductor layer sequence or a high thermal conductivity. A high thermal conductivity is of particular importance in applications in which a critical amount of heat is generated in the vertical emitter during the operation of the semiconductor laser. If the amount of heat generated in the vertical emitter is not sufficiently dissipated from the vertical emitter, then the risk of damage to the vertical emitter is increased. Furthermore, at excessively high temperatures, the efficiency of the vertical emitter decreases greatly. Through the use of a carrier body which is different than the growth substrate and has preferably high thermal conductivity, said risk can advantageously be reduced.

The first and the second semiconductor layer sequences are preferably based on an arsenide, phosphide or nitride compound semiconductor. In this connection, "based on arsenide, phosphide or nitride compound semiconductors" means that a semiconductor laser or part of a semiconductor laser designated in this way preferably comprises $Al_nGa_mIn_{1-n-m}As$, $Al_nGa_mIn_{1-n-m}P$ or $Al_nGa_mIn_{1-n-m}N$, where $0 \leq n \leq 1$, $0 \leq m \leq 1$ and $n+m \leq 1$. Thereby, the material need not necessarily have a mathematically exact composition according to the above formula. Rather, it can have one or more dopants and also additional constituents which substantially do not change the physical properties of the material. For the sake of simplicity, however, the above formula comprises only the essential constituents of the crystal lattice (Al, Ga, In, P, As, N), even if these can be replaced in part by small amounts of further substances.

Preferably, the active layer of the vertical emitter emits infrared radiation.

The active layer of the vertical emitter preferably comprises a multiple quantum well structure (MQW) or a single quantum well structure (SQW) for generating radiation. In the context of the application, the designation quantum well structure encompasses, in particular, any structure in which charge carriers can experience a quantization of their energy states by means of confinement. In particular, the designation quantum well structure does not comprise any indication about the dimensionality of the quantization. It therefore encompasses, inter alia, quantum wells, quantum wires and quantum dots and any combination of these structures.

The vertical emitter is optically pumped by the pump laser. In this case, the wavelength of the optical pump radiation is preferably less than the wavelength of the radiation emitted by the active layer of the vertical emitter. The pump laser has a resonator for the pump radiation. For this purpose, by way of example, mirror areas are formed at two mutually parallel end areas of the pump laser, said mirror areas serving as resonator mirrors. The latter can for example be produced by etching (for example dry etching) and be mirror-coated in a highly reflective fashion.

Preferably, the pump laser structure has an active zone embedded between a first and a second waveguide layer, wherein the waveguide layers are in turn embedded between a first and a second cladding layer.

The vertical emitter is preferably arranged on regions of the pump laser. In this case, the active layer of the vertical emitter is optically coupled to the pump laser structure, such that, during the operation of the semiconductor laser, pump radiation from the pump laser is guided into the active layer of the vertical emitter.

A principle for coupling the pump radiation into the active layer of the vertical emitter is known from the document WO 2005/048423 A1, U.S. equivalent U.S. Pat. No. 7,408,972, for example, the content of which in this regard is incorporated by reference in the present description.

In order to improve the coupling of pump radiation into the vertical emitter, advantageously the refractive index of one waveguide layer of the pump laser is greater than the refractive index of the second waveguide layer of the pump laser and/or the active zone of the pump laser is positioned asymmetrically in the waveguide formed by the two waveguide layers.

A pump laser for optically pumping the active layer of the vertical emitter in which the pump laser has an edge emitting semiconductor structure is furthermore conceivable. In this case, the edge emitting pump laser is arranged in such a way that the pump radiation is radiated into the active layer of the vertical emitter from a lateral direction. In particular, the active layer of the vertical emitter and the pump laser are preferably arranged laterally alongside one another in such a way that the active zone of the pump laser and the active layer of the vertical emitter are at the same level.

In a preferred embodiment of the semiconductor laser, the second semiconductor layer sequence has a radiation-emitting region which comprises the radiation-emitting active layer and emits radiation during operation as a result of optical pumping of the pump laser. Furthermore, the second semiconductor layer sequence has at least one region which does not emit radiation during operation.

In other words, unlike what is conventional, the entire second semiconductor layer sequence is not removed outside the radiation-emitting region provided. Advantageously only the regions in which the first semiconductor layer sequence has to be accessed in subsequent process steps are removed, for example by deeper etching. Subsequent processes can be considered to be, by way of example, mirror etching of the resonator mirrors of the pump laser and/or making electrical contact with the pump laser.

In a preferred embodiment, the first semiconductor layer sequence has both a region which generates pump radiation and at least one region which does not generate pump radiation during operation.

Particularly preferably, the regions of the second semiconductor layer sequence which do not emit radiation during operation are applied on the regions of the first semiconductor layer sequence which do not generate pump radiation during operation.

As a result, the mechanical stability of the semiconductor laser is advantageously increased since both the first and the second semiconductor layer sequences are embodied in large-area fashion, namely apart from the regions which have to be accessible for subsequent processing.

In a further embodiment, the pump laser has a first contact layer on a side facing the vertical emitter, on regions on which the second semiconductor layer sequence is removed. The first contact layer serves for making electrical contact with the pump laser.

In a preferred embodiment, the first semiconductor layer sequence has an etching stop layer on a surface remote from the vertical emitter.

The etching stop layer protects the pump laser from damage which can arise during the stripping-away of the growth substrate as a result of an etching process.

Preferably, a second contact layer is applied to a surface of the etching stop layer which is remote from the pump laser, said second contact layer having a cutout in a region lying opposite the vertical emitter. The second contact layer and the first contact layer serve for jointly making electrical contact with the pump laser. The cutout of the second contact layer in a region lying opposite the vertical emitter serves for the radiation coupling-out of the radiation emitted by the active layer of the vertical emitter.

As an alternative, the second contact layer can be applied on that surface of the pump laser which is remote from the vertical emitter. In this case, the second contact layer additionally serves as an etching stop layer. An additional etching stop layer between pump laser and second contact layer is advantageously not necessary.

The second semiconductor layer sequence is preferably fixed to the carrier body. In this case, the second semiconductor layer sequence can be fixed to the carrier body for example by means of a solder layer, an adhesive layer or thermocompression.

As a result, in contrast to what is conventional, it is not necessary to apply an galvanic layer to the vertical emitter, which layer can disadvantageously lead to strains in the semiconductor laser. As a result, the mechanical stability and at the same time the service life of the semiconductor laser are advantageously increased.

Preferably, the vertical emitter has a mirror on the side remote from the pump laser. Particularly preferably, the vertical emitter has a Bragg mirror on the side remote from the pump laser.

By virtue of the fact that the Bragg mirror is arranged at the side remote from the pump laser, the current feed for the pump laser does not have to be effected via the Bragg mirror. As a result, it is possible to avoid dopings in the Bragg mirror which can lead to a reduced reflectivity of the Bragg mirror and hence to optical losses. This results in reduced absorption of the radiation emitted by the vertical emitter.

Preferably, a plurality of semiconductor lasers are processed in the wafer assemblage, that is to say on a common carrier body or wafer. As a result, the mass production of semiconductor lasers is advantageously possible. In this case, a respective pump laser is preferably arranged in each case at that side of a vertical emitter which is remote from the carrier body.

A method according to the invention for producing a surface emitting semiconductor laser comprises, providing a growth substrate. A first semiconductor layer sequence, which comprises a pump laser, is epitaxially grown. A second semiconductor layer sequence is epitaxially grown onto the first semiconductor layer sequence. The second semiconductor layer sequence comprises a vertical emitter having at least one active zone. Regions of the pump laser are uncovered by partial deep etching of the second semiconductor layer sequence, such that the second semiconductor layer sequence has a radiation-emitting region that emits radiation during operation as a result of optical pumping of the pump laser. The first and the second semiconductor layer sequences have at least one region which does not emit radiation during operation.

The method is advantageously distinguished by a simplified process implementation.

Preferably, prior to uncovering the regions of the pump laser, a Bragg mirror is epitaxially grown onto the second semiconductor layer sequence. As an alternative, after epitaxially growing the second semiconductor layer sequence, a dielectric layer sequence serving as a mirror can be applied to the second semiconductor layer sequence.

Preferably, the regions of the pump laser which are required for the mirror etching and for the electrical connection of the pump laser are uncovered.

Particularly preferably, in order to form a resonator, mirrors are formed in the pump laser by means of mirror etching and the pump laser is electrically connected by application of a first contact layer on that side of the pump laser which is remote from the growth substrate.

By virtue of the fact that only the regions of the second semiconductor layer sequence which have to be accessible for the subsequent processing, such as, for example, mirror etching or electrical connection of the pump laser, are removed, the mechanical stability of the semiconductor laser is increased.

Preferably, a solder layer or an adhesive layer is applied on a side of the second semiconductor layer sequence which is remote from the pump laser. By means of the solder layer or the adhesive layer, a carrier body is fixed to a side of the second semiconductor layer sequence which is remote from the pump laser. As an alternative, the carrier body is fixed by means of thermocompression.

In contrast to what is conventionally customary, it is unnecessary to apply an galvanic layer to the second semiconductor layer sequence. Strains in the semiconductor laser which can arise on account of the galvanic layer are reduced as a result. The stability of the semiconductor laser is advantageously increased.

Preferably, the growth substrate is removed.

By virtue of the fact that the vertical emitter is fixed to a carrier body at a side lying opposite the radiation exit side, the growth substrate is no longer necessary for the mechanical stability of the semiconductor laser. Furthermore, the carrier body of the semiconductor laser is not subject to the comparatively stringent requirements that have to be met by a growth substrate, for instance with regard to the crystal structure. By way of example, the carrier body can be chosen comparatively freely with regard to thermal properties such as, for example, a high thermal conductivity. As a result, the efficiency of the vertical emitter is advantageously improved.

Preferably, an etching stop layer is applied to the growth substrate prior to the growth of the first semiconductor layer sequence.

The etching stop layer advantageously protects the first semiconductor layer sequence and hence the pump laser from damage during the process of stripping away the growth substrate. As a result, during the stripping-away of the substrate, the risk of the pump laser being damaged and of a reduced efficiency of the pump radiation thus being obtained is reduced.

Preferably, the growth substrate is removed and a second contact layer for making electrical contact with the pump laser is applied to the etching stop layer in structured fashion on the surface remote from the pump laser. The etching stop layer is applied by means of lift-off technology, for example.

As a result, a light exit opening for the radiation emitted by the vertical emitter can preferably be realized in the second contact layer, as a result of which efficient coupling-out of the radiation emitted by the vertical emitter is obtained.

As an alternative, the second contact layer can be applied directly to that surface of the pump laser which is remote from the vertical emitter. In this case, the second contact layer serves as an etching stop layer, such that an additional etching stop layer between pump laser and second contact layer is advantageously not necessary.

Preferably, a plurality of semiconductor lasers are processed in the wafer assemblage, that is to say on a common carrier body or wafer. In this case, a plurality of first and second semiconductor layer sequences, and hence a plurality of pump lasers and vertical emitters, are formed on a common carrier body or wafer, wherein a respective pump laser is arranged in each case at that surface of a vertical emitter which is remote from the carrier body. The optoelectronic components thus formed on a common carrier body can subsequently be separated by an etching process, for example by a mesa etching process, and accordingly singulated. As a result, the semiconductor laser can be mass produced, as a result of which the production time and production costs of such a surface emitting semiconductor laser are advantageously reduced.

The carrier body preferably contains Ge, molybdenum or silicon.

BRIEF DESCRIPTION OF THE DRAWINGS

Further features, advantages, preferred configurations and expediencies of the surface emitting semiconductor laser will become apparent from the exemplary embodiments explained below in conjunction FIGS. 1 to 4, in which:

FIGS. 2a-2e show method steps for producing a semiconductor laser according to the invention in accordance with a second exemplary embodiment, FIG. 4 shows a schematic cross section of a further exemplary embodiment of a semiconductor laser according to the invention.

Identical or identically acting constituent parts are in each case provided with the same reference symbols. The constituent parts illustrated and also the size relationships of the constituent parts among one another should not be regarded as true to scale.

DETAILED DESCRIPTION OF ILLUSTRATIVE EMBODIMENTS

Figure 1:
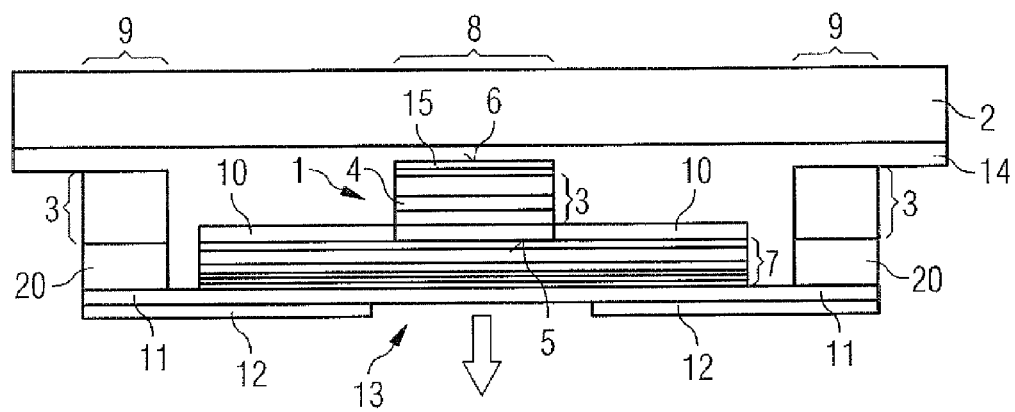
FIG. 1 shows a schematic cross section of a first exemplary embodiment of a semiconductor laser according to the invention.

FIG. 1 illustrates a schematic cross section of a semiconductor laser according to the invention. The semiconductor laser is preferably embodied as a thin-film semiconductor laser. In the context of the application, a thin-film semiconductor laser is considered to be a semiconductor laser during the production of which the growth substrate, onto which a first semiconductor layer sequence 20 and a second semiconductor layer sequence 3 were grown epitaxially, for example, has been stripped away.

The semiconductor laser has a second semiconductor layer sequence 3, which comprises a vertical emitter 1. The vertical emitter 1 has a radiation-emitting active layer 4, a radiation exit side 5 and a connecting side 6. A pump laser 7 is arranged at the radiation exit side 5 of the vertical emitter 1. A carrier body 2 is arranged at the connecting side 6 of the vertical emitter 1. The radiation generated by the active layer 4 of the vertical emitter 1 during operation is coupled out through the pump laser 7. The coupling-out of the radiation generated by the active layer 4 of the vertical emitter 1 during operation is represented by an arrow in FIG. 1.

For the mechanical stabilization of the semiconductor laser, the carrier body 2 is provided, which is arranged at that side of the vertical emitter 1 which lies opposite the radiation exit side 5. In particular, no substrate is provided on the radiation exit side 5 of the vertical emitter 1. Furthermore, an galvanic layer which contains gold, for example, and is conventionally applied to the vertical emitter 1 is not used. Strains which can occur as a result of the galvanic layer therefore do not occur.

The carrier body 2 is preferably different than the growth substrate for the first and the second semiconductor layer sequences. Consequently, the carrier body 2 of the semiconductor laser is advantageously not subject to the comparatively stringent requirements that have to be met by a growth substrate, for instance with regard to the crystal structure. The degrees of freedom in the choice of the carrier body 2 are advantageously increased by comparison with the degrees of freedom in the choice of the growth substrate. By way of example, the carrier body 2 can be chosen comparatively freely with regard to thermal properties such as a high thermal conductivity, or with regard to the coefficient of expansion. If the amount of heat generated in the vertical emitter 1 is not sufficiently dissipated from the vertical emitter 1, then the risk of a reduction of power of the vertical emitter 1 is increased. Through the use of a carrier body 2 which is different than the growth substrate and has preferably high thermal conductivity, said risk can advantageously be reduced.

By virtue of the fact that the growth substrate is stripped away, it is furthermore not necessary to etch a light exit opening for the radiation emitted by the vertical emitter 1 into the growth substrate. Simplified production of the semiconductor laser and hence reduced production costs and a reduced production time for the surface emitting semiconductor laser are advantageously possible.

The vertical emitter 1 and the pump laser 7 are preferably based on an arsenide, phosphide or nitride compound semiconductor. In this connection, "based on arsenide, phosphide or nitride compound semiconductor" means that a semiconductor laser or part of a semiconductor laser designated in this way preferably comprises $Al_nGa_mIn_{1-n-m}As$, $Al_nGa_mIn_{1-n-m}P$ or $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can have one or more dopants and also additional constituents which substantially do not change the physical properties of the material. For the sake of simplicity, however, the above formula comprises only the essential constituents of the crystal lattice (Al, Ga, In, P, As, N), even if these can be replaced in part by small amounts of further substances.

The vertical emitter 1 is preferably a semiconductor laser, particularly preferably a thin-film semiconductor laser. Preferably, the active layer 4 of the vertical emitter 1 emits infrared radiation.

The active layer 4 of the vertical emitter 1 preferably comprises a multiple quantum well structure (MQW) or a single quantum well structure (SQW) for generating radiation. In the context of the application, the designation quantum well structure encompasses, in particular, any structure in which charge carriers can experience a quantization of their energy states by means of confinement. In particular, the designation quantum well structure does not comprise any indication about the dimensionality of the quantization. It therefore encompasses, inter alia, quantum wells, quantum wires and quantum dots and any combination of these structures.

Preferably, the active layer of the vertical emitter 1 is suitable for absorbing the electromagnetic radiation generated in the pump laser 7. In other words, absorption of pump radiation takes place in the active layer 4 of the vertical emitter 1 and excites the generation of electromagnetic radiation layer there.

The vertical emitter 1 is arranged on regions of a pump laser 7. In this case, the active layer 4 of the vertical emitter 1 is optically coupled to the pump laser structure, such that, during operation of the semiconductor laser, pump radiation from the pump laser 7 is guided into the active layer 4 of the vertical emitter 1.

The wavelength of the optical pump radiation is preferably less than the wavelength of the radiation emitted by the active layer of the vertical emitter 1. The pump laser 7 has a resonator for the pump radiation. For this purpose, by way of example, mirror areas are formed at two mutually parallel end areas of the pump laser 7, said mirror areas serving as resonator mirrors. The pump laser structure preferably has an active zone embedded between a first and a second waveguide layer, wherein the waveguide layers are in turn embedded between a first and a second cladding layer.

The second semiconductor layer sequence 3 preferably has a radiation-emitting region 8 which comprises the radiation-emitting active layer 4 and emits radiation during operation as a result of optical pumping of the pump laser 7. The second semiconductor layer sequence 3 has at least one region 9 which does not emit radiation during operation.

In other words, unlike what is conventional, the entire second semiconductor layer sequence 3 is not removed outside the radiation-emitting region 8 provided, rather only the regions in which access to the first semiconductor layer sequence is necessary in subsequent process steps are removed. Subsequent processes can be considered to be, for example, mirror etches of the resonator mirrors of the pump laser 7 and/or making electrical contact with the pump laser 7.

Furthermore, the first semiconductor layer sequence preferably has both a region which generates pump radiation and at least one region 9 which does not generate pump radiation during the operation of the semiconductor laser.

Particularly preferably, the regions 9 of the second semiconductor layer sequence 3 which do not emit radiation during operation are applied on the regions 9 of the first semiconductor layer sequence 20 which do not generate pump radiation during operation.

As a result, the stability of the semiconductor laser is advantageously increased since both the first and the second semiconductor layer sequences 3, 20 are embodied in large-area fashion, namely apart from the regions which have to be accessible for the subsequent processing.

The pump laser 7 preferably has a first contact layer 10 on a surface facing the vertical emitter 1, in regions on which the second semiconductor layer sequence 3 is removed. The first contact layer 10 serves for making electrical contact with the pump laser 7.

The first semiconductor layer sequence 20 preferably has an etching stop layer 11 on the surface remote from the vertical emitter 1. The etching stop layer 11 protects the pump laser 7 from damage which can arise during the stripping-away of the growth substrate.

The etching stop layer 11 preferably has a second contact layer 12 on a surface remote from the pump laser 7, said second contact layer having a cutout 13 in a region lying opposite the vertical emitter 1. The second contact layer 12 and the first contact layer 10 serve for jointly making electrical contact with the pump laser 7. The cutout 13 of the contact layer 12 serves for the radiation coupling-out of the radiation emitted by the active layer 4 of the vertical emitter 1.

As an alternative, it is possible to apply only a second contact layer 12 on that surface of the pump laser 7 which lies opposite the vertical emitter 1. In this case, the second contact layer 12 additionally serves as an etching stop layer.

The second semiconductor layer sequence 3 is fixed to the carrier body 2 for example by means of a solder layer or an adhesive layer 14. As an alternative, the second semiconductor layer sequence 3 can be fixed to the carrier body 2 by means of thermocompression. In contrast to what is conventional, it is not necessary to apply an galvanic layer to the vertical emitter 1, which layer can disadvantageously lead to strains in the semiconductor laser, as a result of which both the stability and the service life of the semiconductor laser are advantageously increased.

Preferably, the vertical emitter 1 has a mirror 15 on the side remote from the pump laser 7. The mirror 15 is preferably a Bragg mirror. By virtue of the fact that the mirror 15 is arranged on the side remote from the pump laser 7, the vertical emitter 1 is optically pumped by the pump laser 7 and it is therefore not necessary to make electrical contact with the vertical emitter 1, the current feed for the pump laser does not have to be effected via the mirror 15. As a result, it is possible to avoid dopings in the mirror 15 which lead to a reduced reflectivity of the mirror 15 and hence to optical losses of the radiation emitted by the vertical emitter 1. Overall, the absorption of the radiation emitted by the vertical emitter 1 in the mirror 15 is thus reduced.

As an alternative, instead of a Bragg mirror, a mirror 15 composed of a dielectric layer sequence can be applied on that surface of the vertical emitter 1 which is remote from the pump laser 7.

The mirror 15 advantageously forms a first resonator mirror of the vertical emitter 1. A second resonator mirror can be arranged in particular as an external resonator mirror outside the semiconductor chip (not illustrated). Therefore, the semiconductor laser is in particular a surface emitting semiconductor laser with an external resonator (VECSEL).

The carrier body 2 preferably contains Ge, molybdenum or silicon, whereby suitable heat dissipation of the heat loss emitted by the vertical emitter 1 is preferably made possible.

FIGS. 2a to 2e illustrate the method steps for producing a semiconductor laser according to the invention.

Figure 2A:
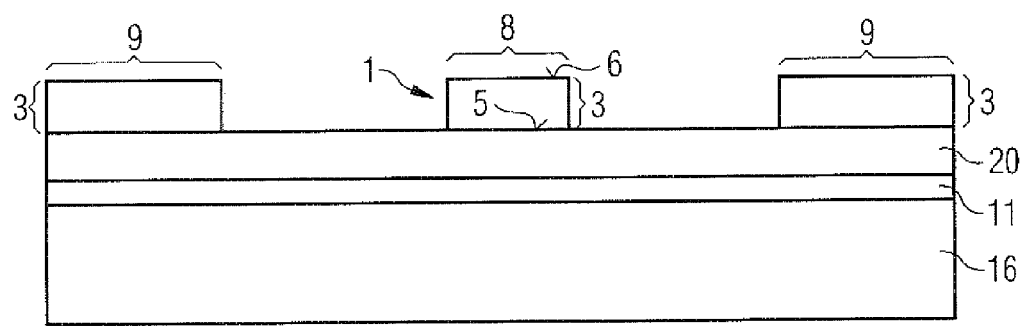

In FIG. 2a, a first semiconductor layer sequence 20 comprising a pump laser is grown epitaxially on a growth substrate 16. An etching stop layer 11 is preferably applied before the first semiconductor layer sequence 20 is grown. The etching stop layer 11 serves to ensure that, in a later process step of stripping away the growth substrate 16, the pump laser is not damaged and an optimum pump radiation efficiency can thus be effected during the operation of the semiconductor laser.

A second semiconductor layer sequence 3 comprising a vertical emitter 1 is grown on to the pump laser. The second semiconductor layer sequence 3 has a region 8 which is provided as a radiation-emitting region and comprises a radiation-emitting active layer 4. Furthermore, the second semiconductor layer sequence 3 has regions 9 which are not provided for emitting radiation. For this purpose, the second semiconductor layer sequence 3 is etched more deeply in regions around the radiation-emitting region 8 provided.

Figure 2B:
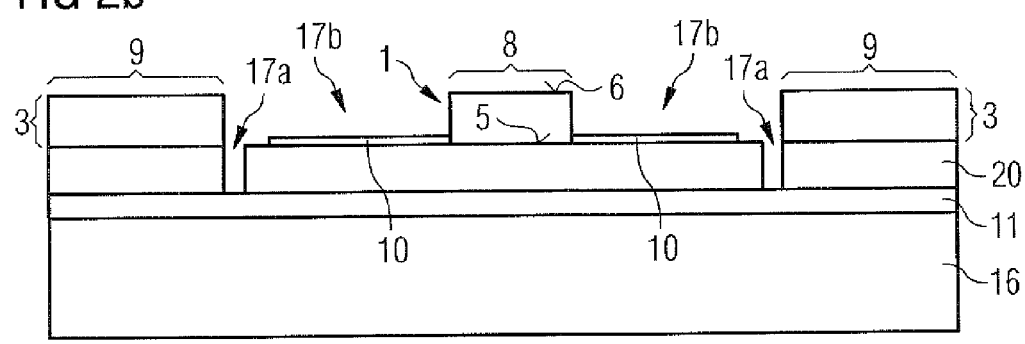

The more deeply etched regions of the second semiconductor layer sequence 3 make it possible, in the subsequent process step, as illustrated in FIG. 2b, to access the required regions of the first semiconductor layer sequence 20. Subsequent process steps provided include, by way of example, the formation of a resonator mirror on side areas 17a of the pump laser 7 by means of mirror etching. Furthermore, a first contact layer 10 is applied on the pump laser 7, onto regions 17b on which no second semiconductor layer sequence 3 is arranged.

The formation of the resonator mirrors in regions 17a of the pump laser 7 serves for forming a resonator for the pump radiation of the pump laser 7. The application of the first contact layer 10 serves for making electrical contact with the pump laser 7.

After the mirror etching of the resonator mirrors of the pump laser 7 and after the electrical connection of the pump laser 7, a carrier body 2 is applied to the second semiconductor layer sequence 3, as illustrated in FIG. 2c, by means of a solder layer or an adhesive layer 14.

Consequently, an galvanic layer containing gold, for example, is not used. As a result, strains in the semiconductor laser which can arise as a result of the galvanic layer do not occur. The mechanical stability of the semiconductor laser is advantageously increased as a result of the first and second semiconductor layer sequences embodied in large-area fashion, as a result of which the service life of the semiconductor laser is furthermore increased.

Afterward, as illustrated in FIG. 2d, the growth substrate 16 is stripped away. In this case, the etching stop layer 11 protects the pump laser 7 from damage which can arise during the stripping-away of the growth substrate 16. By virtue of the fact that the second semiconductor layer sequence 3 is fixed to a carrier body 2, the growth substrate 16 is no longer necessary for the stability of the semiconductor laser and can therefore be completely stripped away.

During the processing of a plurality of semiconductor lasers in the wafer assemblage, the wafer assemblage can be separated into individual semiconductor lasers during this method step. The separation into separated semiconductor lasers is preferably effected by means of mesa etching.

Afterward, as illustrated in FIG. 2e, a second contact layer 12 for making electrical contact with the pump laser 7 is applied in structured fashion on that side of the etching stop layer 11 which is remote from the pump laser 7, for example by means of lift-off technology.

As a result, a light exit opening 13 for the radiation emitted by the vertical emitter 1 can preferably be realized in the second contact layer 12, as a result of which efficient coupling-out of the radiation emitted by the vertical emitter 1 is obtained. The direction of the coupling-out radiation is represented by an arrow in FIG. 2e.

Figure 3:
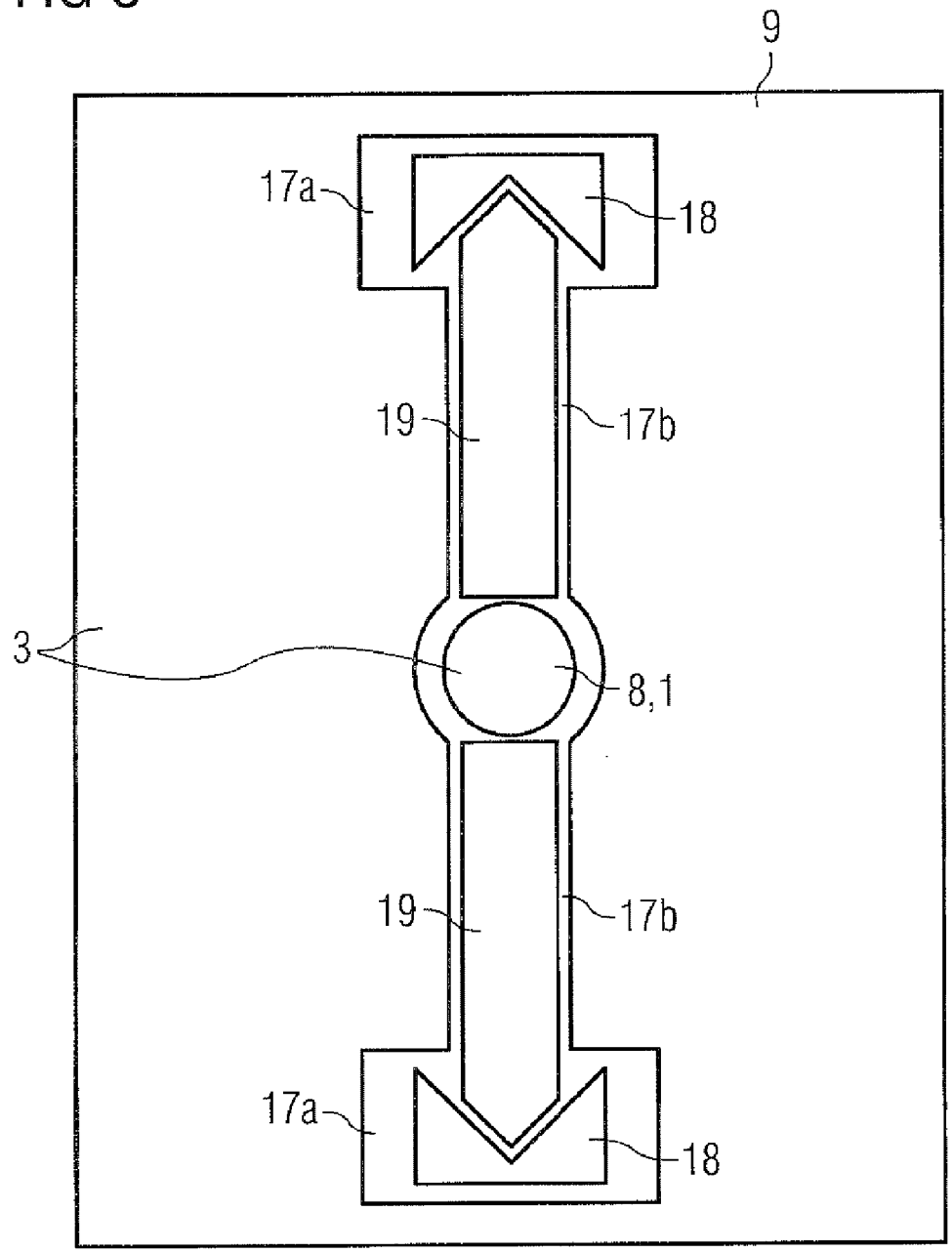
FIG. 3 shows a schematic plan view of a surface emitting semiconductor laser in accordance with the second exemplary embodiment.

FIG. 3 illustrates a schematic plan view of a surface emitting semiconductor laser.

The second semiconductor layer sequence 3 has a radiation-emitting region 8 which emits radiation during the operation of the semiconductor laser as a result of optical pumping of the pump laser (vertical emitter 1). Furthermore, the second semiconductor layer sequence 3 has a region 9 which does not emit radiation during operation.

The radiation-emitting region 8 of the second semiconductor layer sequence 3 is arranged on a pump laser. The pump laser has a resonator 19 for the pump radiation. Resonator mirrors 18 are formed at two opposite sides of the resonator 19.

In regions 17a, 17b the second semiconductor layer sequence 3 is removed by means of an etching process in order to enable access to the first semiconductor layer sequence in these regions during the production of the semiconductor laser. In this case, the regions 17a are provided for forming the resonator mirrors 18. The regions 17b are provided for the electrical connection of the pump laser. All the other regions of the second semiconductor layer sequence 3 are not removed and form a region 9 which does not emit radiation during operation.

By virtue of such an arrangement, the stability of the semiconductor laser is increased since a second semiconductor layer sequence 3 embodied in large-area fashion is provided. Furthermore, the production process is simplified since only the regions of the second semiconductor layer sequence 3 which have to be accessible for production with respect to the first semiconductor layer sequence are removed. The production costs and the production time are advantageously reduced.

FIG. 4 illustrates a cross section of a semiconductor laser, in particular a vertical emitter.

The vertical emitter 1 is preferably embodied as a thin-film vertical emitter and has a radiation-emitting active layer 4, a radiation exit side 5 and a connecting side 6. A carrier body 2 is arranged at the connecting side 6 of the vertical emitter 1 in order to stabilize the vertical emitter 1, said carrier body being different than a growth substrate of the semiconductor layer sequence of the vertical emitter 1.

Preferably, the vertical emitter 1 has a mirror 15 on the side facing the carrier body 2. The mirror 15 is preferably a Bragg mirror.

The mirror 15 advantageously forms a first resonator mirror of the vertical emitter 1. A second resonator mirror 21 can be arranged in particular as an external resonator mirror outside the semiconductor chip. Therefore, the semiconductor laser is in particular a surface emitting semiconductor laser with an external resonator (VECSEL).

The carrier body 2 preferably contains Ge, molybdenum or silicon, whereby suitable heat dissipation of the heat loss emitted by the vertical emitter 1 is preferably made possible.

For improved heat dissipation, a heat sink 22 can be arranged on that side of the carrier body 2 which is remote from the vertical emitter 1. The heat sink 22 is preferably fixed to the carrier body 2 by means of a solder layer or an adhesive layer 23.

A pump laser 7 is arranged at the radiation exit side 5 of the vertical emitter 1.

As an alternative, a pump laser for optically pumping the active layer 4 of the vertical emitter in which the pump laser has an edge emitting semiconductor structure is conceivable (not illustrated). In this case, the edge emitting pump laser is arranged in such a way that the pump radiation is radiated into the active layer 4 of the vertical emitter 7 from a lateral direction. In particular, the active layer 4 of the vertical emitter 1 and the pump laser are preferably arranged laterally alongside one another in such a way that the active zone of the pump laser and the active layer 4 of the vertical emitter 1 are at the same level. In particular, in this case the pump laser and the vertical emitter 1 are arranged on a common carrier body 2.

Furthermore, it is conceivable for the active layer 4 of the vertical emitter to be pumped by means of an external pump laser during the operation of the semiconductor laser (not illustrated).

The explanation of the semiconductor laser according to the invention on the basis of the exemplary embodiments described above should not be regarded as a restriction of the invention thereto. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. A surface emitting semiconductor laser, comprising:
 a first semiconductor layer sequence which comprises a pump laser;
 a second semiconductor layer sequence arranged on the first semiconductor layer sequence, the second semiconductor layer sequence comprising a vertical emitter having a radiation-emitting active layer, a radiation exit side and a connecting side disposed opposite the radiation exit side, wherein the pump laser is arranged at the radiation exit side of the vertical emitter; and
 a carrier body arranged at the connecting side of the vertical emitter;
 wherein the second semiconductor layer sequence has a radiation-emitting region comprising the radiation-emitting active layer;
 wherein the second semiconductor layer sequence has at least one region that does not emit radiation during operation; and wherein the at least one region that does not emit radiation is formed by a region of the second semiconductor layer sequence that is etched more deeply than the radiation-emitting region in regions around the radiation-emitting region.

2. The surface emitting semiconductor laser as claimed in claim 1, wherein the first semiconductor layer sequence has a region that generates pump radiation during operation and wherein the first semiconductor layer sequence has at least one region which does not generate pump radiation during operation.

3. The surface emitting semiconductor laser as claimed in claim 1, wherein the pump laser has a first contact layer on a side facing the vertical emitter, the first contact layer disposed on regions on which there is no second semiconductor layer sequence.

4. The surface emitting semiconductor laser as claimed in claim 1, wherein the first semiconductor layer sequence comprises an etching stop layer on a side remote from the vertical emitter.

5. The surface emitting semiconductor laser as claimed in claim 4, further comprising a second contact layer for making electrical contact with the pump laser located at a surface of the etching stop layer that is remote from the pump laser, the second contact layer having a cutout in a region lying opposite the vertical emitter.

6. The surface emitting semiconductor laser as claimed in claim 1, wherein the second semiconductor layer sequence is fixed to the carrier body.

7. The surface emitting semiconductor laser as claimed in claim 1, wherein the vertical emitter comprises a Bragg minor on the side remote from the pump laser.

8. The surface emitting semiconductor laser as claimed in claim 1, wherein the first and the second semiconductor layer sequences comprise semiconductor layers grown on a growth substrate.

9. The surface emitting semiconductor laser as claimed in claim 1, wherein the carrier body is different than a growth substrate that was used for growing the first and the second semiconductor layer sequences.

10. A method of forming a surface emitting semiconductor laser, the method comprising:
forming a first semiconductor layer sequence which comprises a pump laser;
arranging a second semiconductor layer sequence on the first semiconductor layer sequence, the second semiconductor layer sequence comprising a vertical emitter having a radiation-emitting active layer, a radiation exit side and a connecting side disposed opposite the radiation exit side, wherein the pump laser is arranged at the radiation exit side of the vertical emitter; and
arranging a carrier body at the connecting side of the vertical emitter;
wherein the second semiconductor layer sequence has a radiation-emitting region comprising the radiation-emitting active layer;
wherein the second semiconductor layer sequence has at least one region that does not emit radiation during operation; and
wherein the at least one region that does not emit radiation is formed by a region of the second semiconductor layer sequence that is etched more deeply than the radiation-emitting region in regions around the radiation-emitting region.

11. The method as claimed in claim 10, wherein:
wherein forming the first semiconductor layer sequence comprises providing a growth substrate and epitaxially growing the first semiconductor layer sequence that comprises the pump laser;
wherein arranging the second semiconductor layer sequence comprises epitaxially growing the second semiconductor layer sequence onto the first semiconductor layer sequence, wherein the second semiconductor layer sequence comprises the vertical emitter, which has at least one active zone; and
wherein the method further comprises uncovering regions of the pump laser by etching the second semiconductor layer sequence such that the second semiconductor layer sequence has a radiation-emitting region that emits radiation during operation as a result of optical pumping of the pump laser.

12. The method as claimed in claim 11, further comprising forming a solder layer on a side of the second semiconductor layer sequence that is remote from the pump laser.

13. The method as claimed in claim 11, further comprising removing the growth substrate.

14. The method as claimed in claim 11, further comprising forming an etching stop layer over the growth substrate prior to epitaxially growing the first semiconductor layer sequence.

15. The method as claimed in claim 12, further comprising attaching the second semiconductor layer sequence to a carrier body using the solder layer at a side remote from the pump laser.

16. The method as claimed in claim 11, further comprising attaching the second semiconductor layer sequence to a carrier body at a side remote from the pump laser.

17. The method as claimed in claim 16, wherein the carrier body comprises different material than the growth substrate.

18. The method as claimed in claim 11, wherein uncovering regions of the pump laser comprises partial deep etching of the second semiconductor layer sequence.

19. The surface emitting semiconductor laser as claimed in claim 8, wherein the growth substrate has been stripped away.

20. The surface emitting semiconductor laser as claimed in claim 2, wherein the regions of the second semiconductor layer sequence which do not emit radiation during operation are applied on the regions of the first semiconductor layer sequence which do not generate pump radiation during operation.

21. The method as claimed in claim 11, further comprising forming mirrors in the pump laser to form a resonator, wherein the pump laser is electrically connected by application of a first contact layer on that side of the pump laser that is remote from the growth substrate.

* * * * *

UNITED STATES PATENT AND TRADEMARK OFFICE
CERTIFICATE OF CORRECTION

PATENT NO. : 8,325,778 B2
APPLICATION NO. : 12/808979
DATED : December 4, 2012
INVENTOR(S) : Illek It is certified that error appears in the above-identified patent and that said Letters Patent is hereby corrected as shown below:

In Col. 13, line 31, claim 7, delete "minor" and insert --mirror--.

Signed and Sealed this
Twelfth Day of March, 2013

Teresa Stanek Rea
*Acting Director of the United States Patent and Trademark Office*